(12) United States Patent
Charles et al.

(10) Patent No.: US 10,872,642 B2
(45) Date of Patent: Dec. 22, 2020

(54) SYSTEM COMPRISING A MEMORY CAPABLE OF IMPLEMENTING CALCULATION OPERATIONS

(71) Applicant: Commissariat à l'Énergie Atomique et aux Énergies Alternatives, Paris (FR)

(72) Inventors: Henri-Pierre Charles, Grenoble (FR); Maha Kooli, Grenoble (FR); Jean-Philippe Noel, Eybens (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 79 days.

(21) Appl. No.: 16/224,700

(22) Filed: Dec. 18, 2018

(65) Prior Publication Data

US 2019/0189166 A1  Jun. 20, 2019
US 2020/0227097 A9  Jul. 16, 2020

(30) Foreign Application Priority Data

Dec. 19, 2017 (FR) ..................... 17 62468

(51) Int. Cl.
*G11C 7/10* (2006.01)
*G11C 8/06* (2006.01)
(Continued)

(52) U.S. Cl.
CPC ............ *G11C 7/1006* (2013.01); *G06F 3/061* (2013.01); *G06F 3/0638* (2013.01);
(Continued)

(58) Field of Classification Search
CPC ...... G06F 3/061; G06F 3/0638; G06F 3/0673; G11C 7/1006; G11C 7/109
See application file for complete search history.

(56) References Cited

U.S. PATENT DOCUMENTS

2009/0141537 A1* 6/2009 Arsovski ............. G11C 7/1006
365/154
2016/0232951 A1* 8/2016 Shanbhag ................ G11C 7/16
(Continued)

FOREIGN PATENT DOCUMENTS

EP      3 252 774 A1    12/2017
WO   WO 2016/144726 A1   9/2016

OTHER PUBLICATIONS

Preliminary Search Report for French Application No. 1762468, dated Nov. 15, 2018.

*Primary Examiner* — Ryan Bertram
(74) *Attorney, Agent, or Firm* — Wolf, Greenfield & Sacks, P.C.

(57) ABSTRACT

A memory circuit including: a plurality of elementary storage cells arranged in an array of rows and of columns; a data input/output port; an address input port; a mode selection input port; and an internal control circuit configured to: read a mode selection signal applied to the mode selection port; when the mode selection signal is in a first state, read an address of a row from the address input port and implement a read or write operation in this row; and when the mode selection signal is in a second state, read from the data input/output port an instruction signal and implement an operation including the simultaneous activation in read or write mode of at least two rows.

24 Claims, 4 Drawing Sheets

(51) Int. Cl.
*G06F 3/06* (2006.01)
*H03K 19/20* (2006.01)

(52) U.S. Cl.
CPC .............. *G06F 3/0673* (2013.01); *G11C 8/06* (2013.01); *G11C 7/109* (2013.01); *H03K 19/20* (2013.01)

(56) References Cited

U.S. PATENT DOCUMENTS

| | | | |
|---|---|---|---|
| 2016/0371033 A1* | 12/2016 | La Fratta | G06F 3/0655 |
| 2017/0344301 A1* | 11/2017 | Ryu | G06F 15/785 |
| 2019/0079678 A1* | 3/2019 | Malladi | G06F 3/068 |
| 2019/0172518 A1* | 6/2019 | Chen | G06F 13/4243 |
| 2019/0179560 A1* | 6/2019 | Moon | G11C 7/1018 |
| 2020/0035291 A1* | 1/2020 | Kasibhatla | G11C 7/1006 |

* cited by examiner

SYSTEM COMPRISING A MEMORY CAPABLE OF IMPLEMENTING CALCULATION OPERATIONS

This Applications claims priority to French application number 17/62468, filed Dec. 19, 2017. The entire contents of these applications are incorporated herein by reference in their entirety.

BACKGROUND

The present application concerns the field of memory circuits. It more particularly aims at a memory circuit capable of implementing calculation operations. It further aims at a system comprising a memory circuit capable of implementing calculation operations and a microprocessor coupled to this memory circuit.

DISCUSSION OF THE RELATED ART

A memory circuit capable not only of storing data, but also of executing, in situ, during accesses to the memory content, a number of logic and/or arithmetic operations having as operands data stored in the circuit, has already been provided in French patent application No 16/54623 (DD16812/B14843) filed by the applicant on May 24, 2016. This circuit comprises, as in a conventional memory circuit, a plurality of elementary cells arranged in rows and columns, and a control circuit capable of implementing data read or write operations in rows of the array. Unlike a conventional memory circuit where only one row of the array can be selected at a time during a read operation, the control circuit is capable of simultaneously selecting in read mode a plurality of rows of the array to perform a logic operation having as operands data contained in the selected rows.

The present application concerns the issue of the control of such a memory circuit and, more particularly, of the cooperation between such a memory circuit and a microprocessor coupled to the memory circuit, particularly to allow a use of the memory circuit both as a conventional memory and as an intelligent memory circuit to implement calculation operations.

SUMMARY

Thus, an embodiment provides a memory circuit comprising:
a plurality of elementary storage cells arranged in an array of rows and columns;
a data input/output port;
an address input port;
a mode selection input port; and
an internal control circuit configured to:
read a mode selection signal applied to the mode selection port;
when the mode selection signal is in a first state, read an address of a row from the address input port and implement, via the data input/output port, a read or write operation in this row; and
when the mode selection signal is in a second state, read from the data input/output port an instruction signal and implement an operation comprising the simultaneous activation in read or write mode of at least two rows selected according to the instruction signal.

According to an embodiment, the internal control circuit is capable of, when the mode selection signal is in the second state, implementing a calculation operation comprising the simultaneously activation in read mode of at least two rows selected according to the instruction signal.

According to an embodiment, the internal control circuit is further configured to, when the mode selection signal is in the second state, read an address signal from the address input port and write at the corresponding address of the memory circuit a result of the calculation operation.

According to an embodiment, the internal control circuit is capable of, when the mode selection signal is in the second state, implementing an operation of writing of same data into at least two rows selected according to the instruction signal.

According to an embodiment, the instruction signal comprises a first field defining a type of operation to be implemented and a second field defining the addresses of the rows to be selected to implement the operation.

According to an embodiment, the second field comprises a first sub-field and a second sub-field of $\log_2(N)$ bits each, where N is an integer designating the number of rows of the array.

According to an embodiment, the internal control circuit comprises a row selection circuit capable of generating an N-bit row selection vector from first and second sub-fields of the second field of the instruction signal.

According to an embodiment, the row selection circuit comprises $Q=\log_2(N)$ stages $E_j$, j being an integer in the range from 0 to $Q-1$, each stage $E_j$ comprising a first logic selection cell comprising first and second input nodes and first and second output nodes, and $2^j$ second logic selection cells, each comprising first, second, and third input nodes and first and second output nodes.

According to an embodiment:
in each stage $E_j$, each second cell of the stage has its second and third input nodes respectively connected to the first and second output nodes of the first cell in the stage; and
in each stage $E_j$ except for stage $E_{Q-1}$, each second stage has its first output node connected to the first input node of one of the second cells of stage $E_{j+1}$ and its second output node connected to the first input node of another one of the second cells of stage $E_{j+1}$.

According to an embodiment:
each first cell comprises first and second logic OR gates, the first OR gate having a first input connected to the first input node of the cell, a second input connected to the second input node of the cell, and an output connected to the first output node of the cell, and the second OR gate having a first input connected to the first input node of the cell, a second input coupled to the second input node of the cell via an inverter, and an output connected to the second output node of the cell; and
each second cell comprises first and second logic AND gates, the first AND gate having a first input connected to the first input node of the cell, a second input connected to the second input node of the cell, and an output connected to the first output node of the cell, and the second AND gate having a first input connected to the first input node of the cell, a second input connected to the third input node of the cell, and an output connected to the second output node of the cell.

According to an embodiment, the internal control circuit is configured to, when the mode selection signal is in the second state, apply the $\log_2(N)$ bits of the first sub-field respectively to the $\log_2(N)$ second input nodes of the first cells of the row selection circuit, and apply the $\log_2(N)$ bits of the second sub-field respectively to the $\log_2(N)$ first input nodes of the first cells of the row selection circuit.

Another embodiment provides a system comprising a microprocessor and a memory circuit such as defined hereabove, the system further comprising:

a data bus coupling a data input/output port of the microprocessor to the data input/output port of the memory circuit;

an address bus coupling an address output port of the microprocessor to the address input port of the memory circuit; and a mode selection bus coupling a mode selection output port of the microprocessor to the mode selection input port of the memory circuit.

According to an embodiment, the microprocessor is configured to:

in a first operating mode:
apply a mode selection signal in the first state to the mode selection bus;
apply a row address signal to the address bus; and
read or write data from or into the corresponding row of the memory circuit via the data bus, and in a second operating mode:
apply a mode selection signal in the second state to the mode selection bus; and
apply an instruction signal to the data bus.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
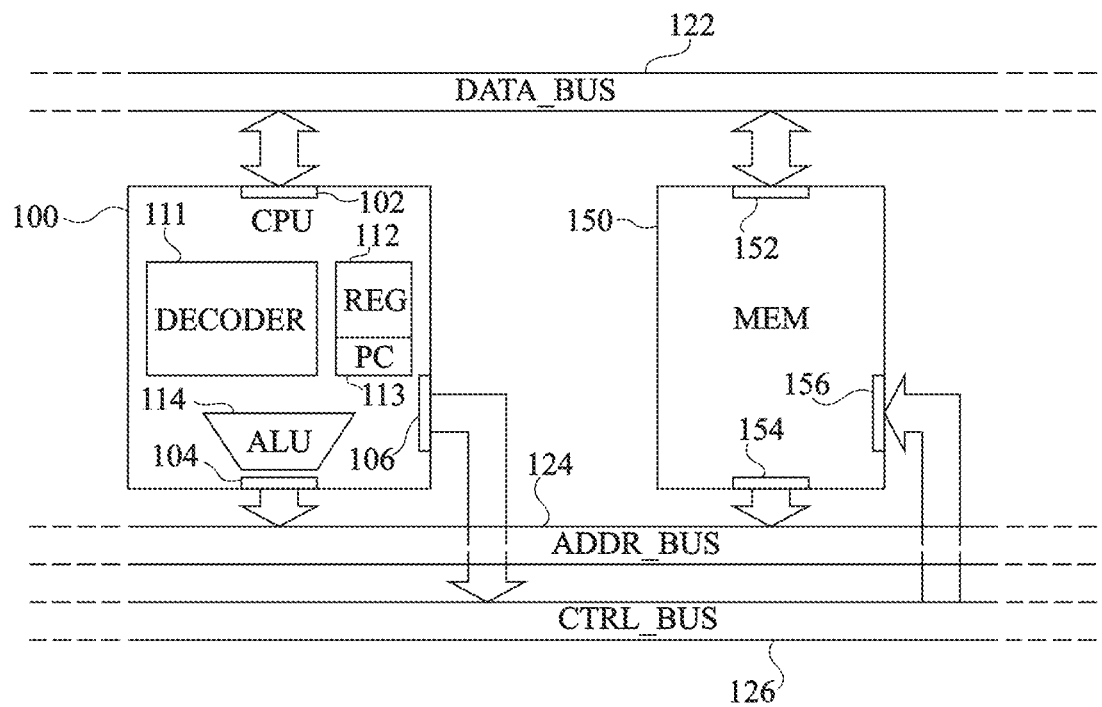
FIG. 1 is a simplified electric diagram of a system comprising a microprocessor and a memory circuit.

The same elements have been designated with the same reference numerals in the different drawings. For clarity, only those steps and elements which are useful to the understanding of the described embodiments have been shown and are detailed. In particular, the complete forming of a memory circuit capable of implementing calculation operations by simultaneous activation in read mode of a plurality of rows of an array of elementary cells has not been detailed, the described embodiments being compatible with known architectures of such circuits, and particularly those described in above-mentioned French patent application No. 16/54623. The means of communication between the memory circuit and a microprocessor external to the memory circuit are here more particularly considered. In the present description, the term "connected" is used to designate a direct electric connection, with no intermediate electronic component, for example, by means of one or a plurality of conductive tracks, and the term "coupled" or the term "linked" is used to designate a connection which may be direct (then meaning "connected") or which may be performed via one or a plurality of components.

FIG. 1 is a simplified electric diagram of an example of a system comprising a microprocessor 100 (CPU) and a conventional memory circuit 150 (MEM).

In this example, the system comprises a data bus 122 (DATA_BUS) which couples, for example, connects, a data input/output port 102 of microprocessor 100 to a corresponding input/output port 152 of memory circuit 150.

The system further comprises an address bus 124 (ADDR_BUS) which couples, for example, connects, an address output port 104 of microprocessor 100 to a corresponding address input port 154 of memory circuit 150.

The system further comprises a control bus 126 (CTRL_BUS) which couples, for example, connects, a control output port 106 of microprocessor 100 to a corresponding control input port 156 of memory circuit 150. Control bus 126 particularly enables to activate the memory circuit in read or in write mode.

Input and/or output port here means an assembly of one or of a plurality of input and/or output conductive terminals intended to receive and/or to supply a digital signal over one or a plurality of bits. Further, bus designates an assembly of one or of a plurality of conductive elements, for example, one or a plurality of conductive tracks or one or a plurality of conductive wires, respectively coupling the terminal(s) of a port of the microprocessor to the corresponding terminal(s) of a port of the memory, and intended to transport a digital signal over one or a plurality of bits from the microprocessor to the memory, or conversely.

In practice, the data and address buses and ports are capable of transmitting signals of a plurality of bits in parallel, for example, from 8 to 64 bits for the data bus and from 20 to 60 bits for the address bus, that is, they each comprise a plurality of parallel conductors. The bus and the control port may, according to architectures, comprise a single conductor (enabling to transmit a single binary signal), or a plurality of parallel conductors (enabling to transmit a signal of a plurality of bits in parallel).

To read data from memory circuit 150, microprocessor 100 applies the address of the data to be read to address input port 154 of the memory circuit (via address output port 104 of the microprocessor and address bus 124), and applies a read control signal to input control port 156 of the memory circuit (via control output port 106 of the microprocessor and control bus 126). The microprocessor then reads the corresponding data from data input/output port 152 of the memory circuit (via data bus 122 and data input/output port 102 of the microprocessor).

To write data into memory circuit 150, microprocessor 100 applies the address of the memory area to be written into to address input port 154 of the memory circuit (via address output port 104 of the microprocessor and address bus 124), applies the data to be written to data input/output port 152 of the memory circuit (via data input/output port 102 of the microprocessor and data bus 122) and applies a write control signal to control input port 156 of the memory circuit (via control output port 106 of the microprocessor and control bus 126).

Microprocessor 100 is capable of executing a sequence of instructions stored in a specific instruction storage portion of the memory circuit 150, for example, to perform operations of processing of data stored in another portion of memory circuit 150 or in another memory circuit (not shown) coupled to the same address, data, and control buses as memory circuit 150.

To achieve this, in the example of FIG. 1, the microprocessor comprises an instruction decoding circuit 111 (DECODER), an internal memory circuit 112 (REG) comprising one or a plurality of temporary data storage registers, an instruction counter 113 (PC), and an arithmetic and logic unit 114 (ALU) capable of implementing basic arithmetic and/or logic operations to process data contained in internal memory circuit 112. For each new instruction, instruction counter 113 is incremented. Each instruction is read from the corresponding address of memory circuit 150, determined according to the state of instruction counter 113. The instruction is then decoded by instruction decoder 111 of the microprocessor, and then executed by the microprocessor, it being understood that the execution of the instruction may or may not comprise an access in read or write mode to memory circuit 150.

Figure 2:
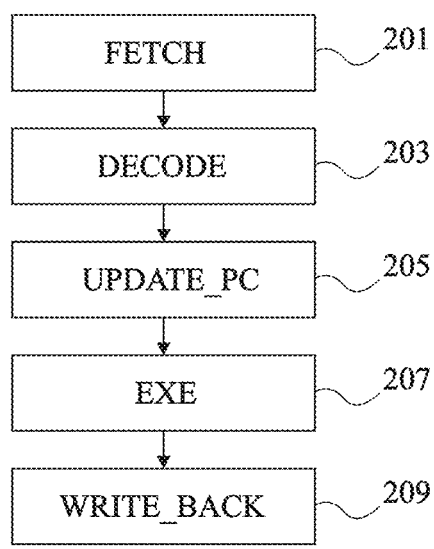
FIG. 2 is a diagram illustrating an example of implementation of a conventional calculation operation in the system of FIG. 1.

FIG. 2 is a diagram illustrating an example of a method of implementation of a calculation operation in the system of FIG. 1. More particularly, it is considered in this example that the internal memory circuit 112 of microprocessor 100 comprises two data storage registers r0 and r1 (not detailed in FIG. 1) and the implementation of a calculation instruction of type "add r0, r1, CST" (in assembly language), comprising adding to the content of register r1 constant value CST, and writing the result of the addition into register r0, is considered as an illustration.

The method of FIG. 2 comprises an initial step 201 (FETCH) of reading of the instruction from memory circuit 150. To achieve this, the microprocessor applies to address input port 154 of circuit 150 (via address bus 124) the address of the instruction to be read, determined according to the value of instruction counter 113. The microprocessor applies at the same time a read control signal to control input port 156 of memory circuit 150 (via control bus 126). The instruction, coded in the form of digital data, is then read by the microprocessor from data input/output port 152 of memory circuit 150 (via data bus 122).

The method of FIG. 2 further comprises a step 203 (DECODE) of decoding, by instruction decoder 111 of the microprocessor, the instruction read at step 201.

The method of FIG. 2 further comprises a step 205 of updating (UPDATE_PC) instruction counter 113, for example comprising incrementing counter 113.

The method of FIG. 2 further comprises a step 207 (EXE) of execution of the actual instruction, that is, in the present example, of execution, by arithmetic and logic unit 114, of addition r1+CST.

The method of FIG. 2 further comprises a step 209 (WRITE_BACK) of writing the result of the operation into register r0.

Figure 3:
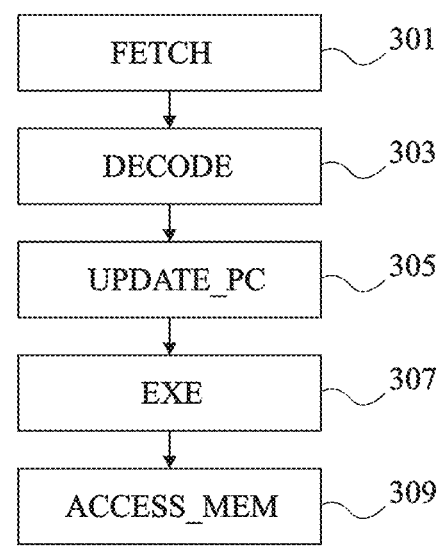
FIG. 3 is a diagram illustrating an example of implementation of a conventional storage and read operation in the system of FIG. 1.

FIG. 3 is a diagram illustrating an example of a method of implementation of an operation of data storage in a memory in the system of FIG. 1. More particularly, it is considered, as in the previous example, that internal memory circuit 112 of microprocessor 100 comprises two data storage registers r0 and r1, and the implementation of a data storage instruction of the type "store r0, r1" (in assembly language), comprising storing the value contained in register r1 at the address contained in register r0, is considered as an illustration.

The method of FIG. 3 comprises initial steps 301 (FETCH), 303 (DECODE), 305 (UPDATE_PC), and 307 (EXE) similar or identical to steps 201, respectively 203, respectively 205, respectively 207 of the method of FIG. 2. In the example of FIG. 3, during step 307, the values stored in registers r0 and r1 are respectively applied to address port 104 and to data port 102 of the microprocessor. Further, a write control signal is applied to control port 106 of the microprocessor.

The method of FIG. 3 further comprises a step 309 (ACCESS_MEM) of access to the memory to effectively perform the memory write operation. During this step, the microprocessor applies to the address input port 154 of memory circuit 150 (via address bus 124) the address stored in register r0 of internal memory circuit 112, applies to the data input/output port 152 of memory circuit 150 (via data bus 122) the data contained in register r1, and applies to the control input port 156 of memory circuit 150 (via control bus 126) a write control signal.

To implement an operation of loading of data stored in the memory circuit, for example, an operation of type "load r0, r1" (in assembly language), comprising writing into register r1 the value stored in the memory circuit at the address contained in register r0, the method is similar to that of FIG. 3, with the difference that steps 307/309 then are a read access to memory circuit 150. More particularly, during step 309, the microprocessor applies to the address input port 154 of memory circuit 150 (via address bus 124) the address stored in register r0, applies to the control input port 156 of memory circuit 150 (via control bus 126) a read control signal, and then writes into register r1 the data read from the data input/output port 152 of memory circuit 150 (via data bus 122).

Figure 4:
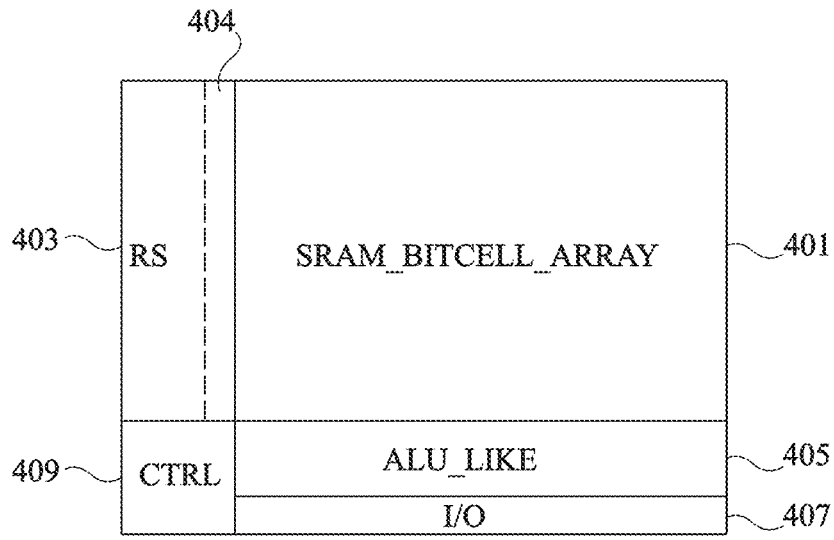
FIG. 4 is a simplified block diagram of an embodiment of a memory circuit capable of implementing calculation operations.

FIG. 4 is a very simplified diagram illustrating, in the form of functional blocks, an embodiment of a memory circuit capable of implementing calculation operations. The memory circuit of FIG. 4 comprises an array 401 (SRAM_BITCELL_ARRAY) of elementary cells, for example, SRAM cells. As an example array 401 is similar to the arrays described in above-mentioned French patent application No 16/54623. The memory circuit of FIG. 4 further comprises a row selection circuit 403 (RS) capable of selecting a single row of array 401 to perform a conventional read or write operation, or of simultaneously selecting in read mode one or a plurality of rows of array 401, to implement, on the output conductive tracks of the columns of the array, basic logic operations having as operands data stored in the selected rows. Row selection circuit 403 may comprise a specific N-bit register 404, where N designates the number of rows of array 401, capable of containing an operand selection vector, as will be detailed hereafter in relation with FIGS. 6, 7, and 8. The memory circuit of FIG. 4 further comprises a logic calculation circuit 405 (ALU_LIKE) capable of implementing additional calculation operations based on the signals read from the output conductive tracks of the columns of the array. The memory circuit of FIG. 4 further comprises an input/output circuit 407 (I/O) coupling the columns of the array to connection terminals outside of the memory circuit, for example, to a data input/output port (not detailed in FIG. 4) of the memory circuit. The memory circuit of FIG. 4 further comprises a control circuit 409 (CTRL) coupled to circuits 403, 405, and 407.

Figure 5:
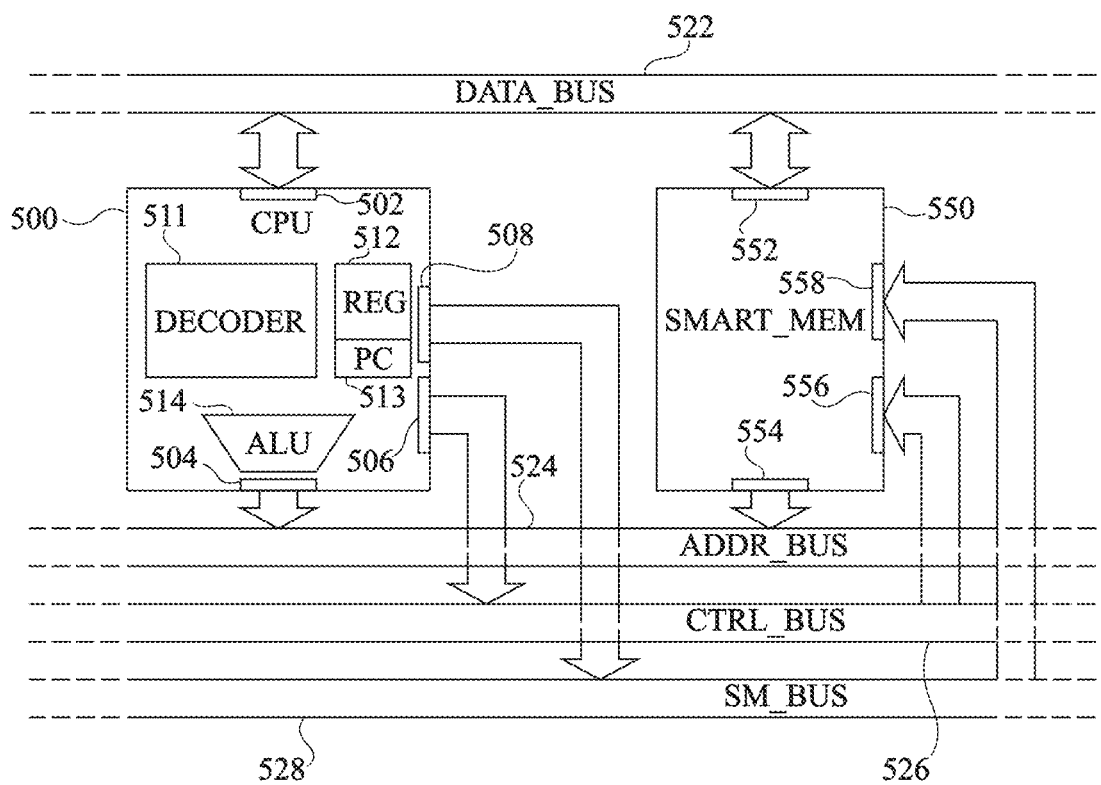
FIG. 5 is a simplified electric diagram of an embodiment of a system comprising a microprocessor and a memory circuit capable of implementing calculation operations.

FIG. 5 is a simplified electric diagram of an embodiment of a system comprising a microprocessor 500 (CPU) and a memory circuit 550 (SMART_MEM) capable of implementing calculation operations, for example, a memory circuit of the type described in relation with FIG. 4. In the embodiment of FIG. 5, it has been attempted to keep a system architecture as close as possible to a conventional architecture such as described in relation with FIG. 1.

In this example, the system comprises a data bus 522 (DATA_BUS) which couples, for example, connects, a data input/output port 502 of microprocessor 500 to a corresponding input/output port 552 of memory circuit 550.

The system further comprises an address bus 524 (ADDR_BUS) which couples, for example, connects, an address output port 504 of microprocessor 500 to a corresponding address input port 554 of memory circuit 550.

The system further comprises a control bus 526 (CTRL_BUS) which couples, for example, connects, a control output port 506 of microprocessor 500 to a corresponding control input port 556 of memory circuit 550.

The data, address, and control buses and ports of the system of FIG. 5 are for example identical or similar to those of the system of FIG. 1. As will be explained in further detail hereafter, the use of such data, address, and control buses and ports is however different from the conventional use, particularly to enable to control the memory circuit in order to implement calculation operations.

The system of FIG. 5 further comprises an operating mode selection bus 528 (SM_BUS) which couples, for example, connects, an operating mode selection output port 508 of microprocessor 500 to a corresponding operating mode selection input port 558 of memory circuit 550.

As an example, the operating mode selection bus and ports of the system of FIG. 5 comprise a single conductor (enabling to transmit a single binary signal) or a plurality of parallel conductors (enabling to transmit a signal of a plurality of bits in parallel).

Although the operating mode selection bus and ports of the system of FIG. 5 have been shown as being separate from the data, address, and control buses and ports of the system, the described embodiments are not limited to this specific example. In practice, the operating mode selection bus and ports of the system of FIG. 5 may correspond to unused conductors of the data, address, and control buses and ports of the system.

Microprocessor 500 comprises an instruction decoder 511 (DECODER), an internal memory circuit 512 (REG) comprising one or a plurality of temporary data storage registers, an instruction counter 513 (PC), and an arithmetic and logic unit 514 (ALU). Circuits 511, 512, 513, and 514 of microprocessor 500 are for example identical or similar to circuits 111, respectively 112, respectively 113, respectively 114 of microprocessor 100 of FIG. 1.

To read or write data into memory circuit 550, microprocessor 500 controls memory circuit 550 according to a first so-called conventional operating mode. For this purpose, microprocessor 500 applies an operating mode selection signal having a first state or having a first value to operating mode selection input port 558 of the memory circuit (via operating mode selection output port 508 of the microprocessor and operating mode selection bus 528). The signals applied to address, data, and control buses and ports are similar to what has been described in relation with FIG. 1. In other words, for a data reading operation in the memory circuit, the microprocessor applies the address of the data to be read to address input port 554 of the memory circuit (via address output port 504 of the microprocessor and address bus 524), and applies a read control signal to input control port 556 of the memory circuit (via control output port 506 of the microprocessor and control bus 526). The microprocessor then reads the corresponding data from data input/output port 552 of the memory circuit (via data bus 522 and data input/output port 502 of the microprocessor). To write data into the memory circuit, the microprocessor applies the address of the memory area to be written into to address input port 554 of the memory circuit (via address output port 504 of the microprocessor and address bus 524), applies the data to be written to data input/output port 552 of the memory circuit (via data input/output port 502 of the microprocessor and data bus 522), and applies a write control signal to control input port 556 of the memory circuit (via control output port 506 of the microprocessor and control bus 526).

To perform a calculation operation directly within memory circuit 550, microprocessor 500 controls the memory circuit according to a second so-called intelligent operating mode. For this purpose, the microprocessor applies an operating mode selection signal having a second state or having a second value to operating mode selection input port 558 of the memory circuit (via operating mode selection output port 508 of the microprocessor and operating mode selection bus 528). The microprocessor further simultaneously applies an instruction signal to data input/output port 552 of the memory circuit (via data input/output port 502 of the microprocessor and bus 522). The microprocessor may further simultaneously apply an address signal to address input port 554 of the memory circuit (via address output port 504 of the microprocessor and address bus 524), to indicate to the memory circuit into which memory location the result of the calculation operation should be written.

The internal control circuit of memory circuit 550 (circuit 409 of FIG. 4) is capable of reading the mode selection signal applied to mode selection input port 558 of the memory circuit.

When the operating mode selection signal is in the first state, corresponding to the conventional operating mode of the memory circuit, the internal control circuit of the memory circuit interprets the signals applied to the address, data, and control buses and ports as conventional control signals. More particularly, the address signal applied to address input port 554 is read and decoded (by the control circuit and/or the row selection circuit), and the corresponding row is activated to implement the required read or write operation.

When the operating mode selection signal is in the second state, corresponding to the intelligent operating mode of the memory circuit, the internal control circuit of the memory circuit interprets the signal applied to the data input/output port of the memory circuit as an instruction signal indicating to the memory circuit which calculation operation should be executed and in which rows of the memory circuit the operands of this calculation are located. The instruction signal is read and decoded (by the control circuit and the row selection circuit) and the corresponding rows are activated in read mode to implement the required calculation operation. The result of the calculation operation can be directly rewritten into memory circuit 550 (without transiting again through the internal memory circuit of the microprocessor), at the address indicated on address input port 554 of the memory circuit.

An advantage of the system of FIG. 5 is that it enables to perform conventional accesses to memory circuit 550, for example, to perform conventional calculation operations by means of arithmetic and logic unit 504 of microprocessor 500 and intelligent accesses to memory circuit 550, to perform calculation operations directly within memory circuit 550 to relieve arithmetic and logic unit 504 of the microprocessor and limit data exchanges between memory circuit 550 and microprocessor 500.

Figure 6:
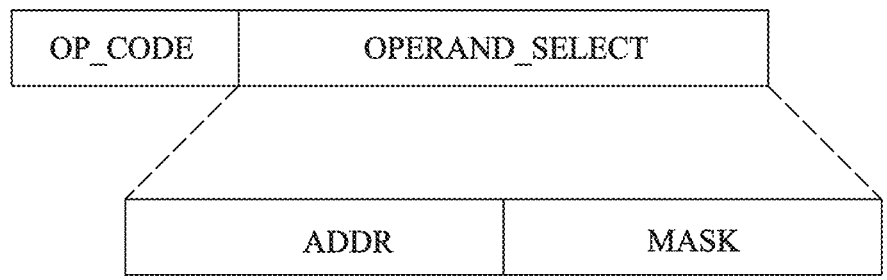
FIG. 6 schematically illustrates an example of a format of an instruction signal used by the microprocessor to control the memory circuit in the system of FIG. 5.

FIG. 6 schematically illustrates an example of a format of an instruction signal used by microprocessor 500 of the system of FIG. 5, to control the implementation of a calculation operation by the memory circuit 550 of the system.

The instruction signal shown in FIG. 6 is a signal over a plurality of bits applied by the microprocessor to the data input/output port 552 of memory circuit 550.

This instruction signal comprises a first field OP_CODE over one or a plurality of bits, defining the type of logic or arithmetic operation to be performed within the memory circuit.

The instruction signal further comprises a second field OPERAND_SELECT over a plurality of bits, defining the addresses of the rows containing the operands of the operation to be carried out.

It should be noted that a calculation operation implemented within the memory circuit may comprise a high number of operands, for example, greater than two, capable of ranging up to the total number of rows of the memory circuit. A problem which is posed is that of the addressing of the operand data. Indeed, in a conventional memory circuit of N rows, where N is an integer greater than or equal to 2 (for example a power of 2), the control circuit generally comprises a single row address decoder capable of receiving an address coded over $\log_2(N)$ bits, and of activating the corresponding row for an operation of reading from or writing into this row. To enable to simultaneously activate in read mode K different rows of the array to perform a logic operation with K operands, where K is an integer greater than or equal to 2, a possibility would be to replicate K times the row address decoder, to be able to simultaneously transmit the K operand addresses to the control circuit on implementation of a calculation operation. Such a solution however implies a significant increase in the surface area and in the power consumption of the memory circuit, and is in practice not compatible with usual dimensions of buses coupling a memory circuit to a microprocessor, particularly when the number of operands K is significant (for example, K=N).

Thus, in a preferred embodiment, field OPERAND_SELECT of the instruction signal of FIG. 6 defines, in coded form, an operand selection vector enabling to identify the rows to be selected on implementation of the calculation operation. The operand selection vector for example comprises N bits, where N is the number of rows of the memory circuit. The operand selection vector is used as a selection mask to simultaneously activate in read mode a plurality of rows of the memory circuit on implementation of the calculation operation. As an example, for each bit of the operand selection vector, the corresponding row of the array is activated in read mode if the corresponding bit of the operand selection vector is at binary value '1', and is not activated in read mode if the corresponding bit of the operand selection vector is at binary value '0'.

As an example, field OPERAND_SELECT contains two sub-fields ADDR and MASK of $\log_2(N)$ bits each, the combination of which defines an N-bit operand selection vector.

The decoding of field OPERAND_SELECT may be performed within the memory circuit, for example, by the row selection circuit of the memory circuit. Once decoded, the row selection vector may be stored into a specific register of the memory circuit to activate in read mode the selected rows on implementation of the actual calculation operation. An embodiment of a decoding circuit capable of generating an operand selection vector from field OPERAND_SELECT will now be described in relation with FIGS. 7 and 8.

Figure 7:
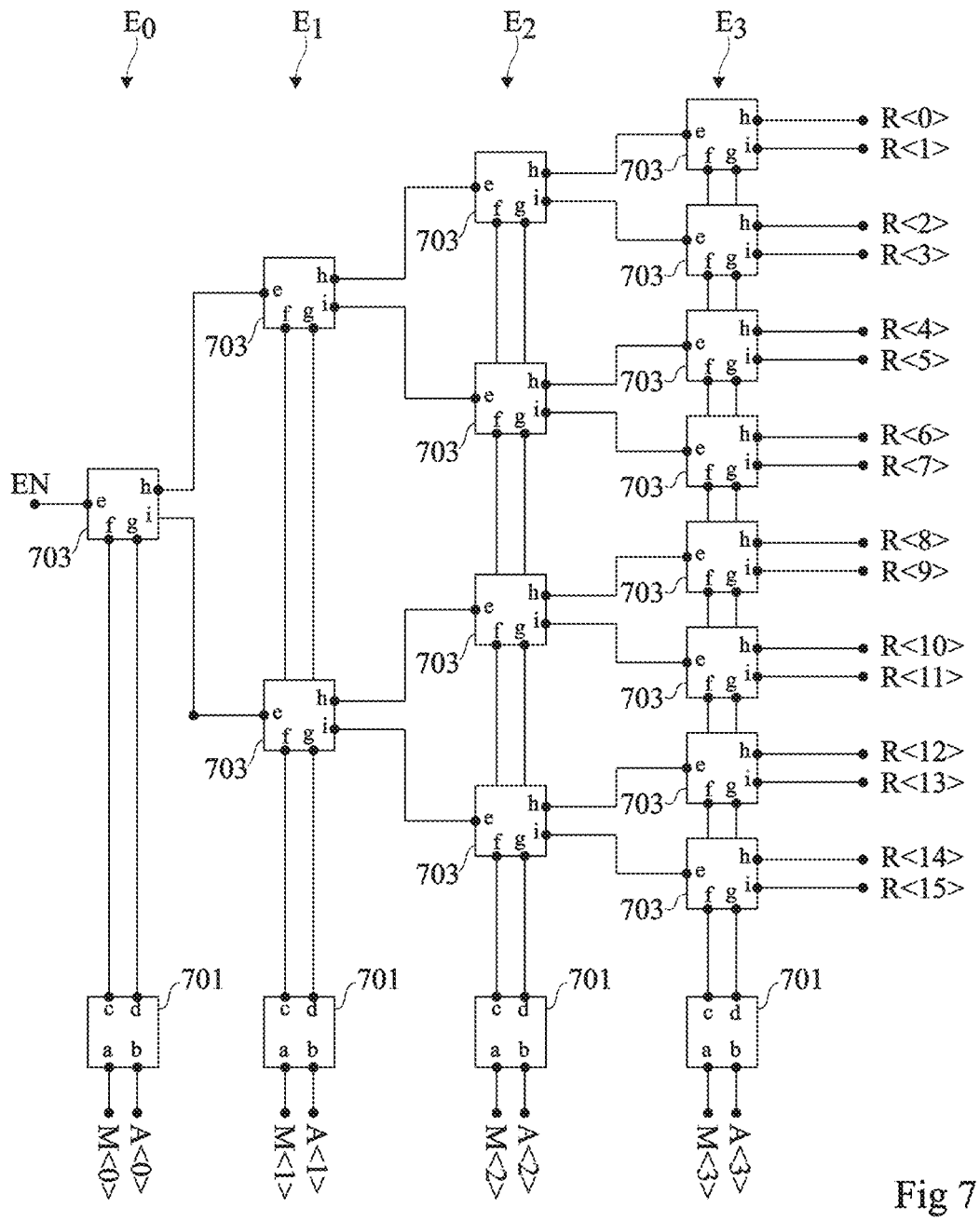
FIG. 7 is a simplified electric diagram of an example of a row selection circuit of a memory circuit capable of implementing calculation operations.

FIG. 7 is a simplified electric diagram of an embodiment of a row selection circuit of a memory circuit capable of implementing calculation operations (for example, row selection circuit 403 of FIG. 4).

A number N of selectable rows equal to 16 is considered in the present example, it being understood that it will be within the abilities of those skilled in the art to adapt the described circuit to a different number of rows.

The circuit of FIG. 7 comprises first elementary selection logic cells 701 having two inputs a and b and two outputs c and d each, and second elementary selection logic cells 703 having three inputs e, f, and g and two outputs h and i each.

More particularly, the circuit of FIG. 7 comprises $Q=\log_2(N)$ stages $E_j$, j being an integer in the range from 0 to $Q-1$ (Q=4 in the present example), each stage $E_j$ comprising one cell 701 and $2^j$ cells 703.

In each stage $E_j$, each cell 703 of the stage has its input nodes f and g respectively connected to output nodes c and d of cell 701 of the stage.

Further, in each stage $E_j$ except for stage $E_{Q-1}$, each cell 703 of the stage has its output node h connected to the input node e of one of the cells 703 of stage $E_{j+1}$ and its output node i connected to the input node e of another one of cells 703 of stage $E_{j+1}$, it being understood that:

in each stage $E_j$ except for stage $E_{Q-1}$, each cell 703 of the stage has its output node h connected to the input node e of one and the same cell 703 of stage $E_{j+1}$ and has its output node i connected to the input node e of one and the same cell 703 of stage $E_{j+1}$; and in each stage $E_j$ except for stage $E_0$, each of cells 703 of the stage has its input node e connected to one and the same output node h or i of a cell 703 of stage $E_{j-1}$.

The truth table of cells 701 is the following (designating the logic input and output signals of a cell 701 with the same references as the corresponding input and output terminals of the cell):

| a | b | c | d |
|---|---|---|---|
| 0 | 0 | 0 | 1 |
| 0 | 1 | 1 | 0 |
| 1 | 0 | 1 | 1 |
| 1 | 1 | 1 | 1 |

The truth table of cells 703 is the following (designating the logic input and output signals of a cell 703 with the same references as the corresponding input and output terminals of the cell):

| e | f | g | h | i |
|---|---|---|---|---|
| 0 | 0 | 0 | 0 | 0 |
| 0 | 0 | 1 | 0 | 0 |
| 0 | 1 | 0 | 0 | 0 |
| 0 | 1 | 1 | 0 | 0 |
| 1 | 0 | 0 | 0 | 0 |
| 1 | 0 | 1 | 0 | 1 |
| 1 | 1 | 0 | 1 | 0 |
| 1 | 1 | 1 | 1 | 1 |

The circuit of FIG. 7 operates as follows.

On implementation of a calculation operation within the memory circuit, the $Q=\log_2(N)$ bits of sub-field MASK of field OPERAND_SELECT of the instruction signal are respectively applied, in parallel, to the input terminals a of the cells 701 of stages $E_0$ to $E_{Q-1}$ of the row selection circuit. Further, the $Q=\log_2(N)$ bits of sub-field ADDR of field OPERAND_SELECT of the instruction signal are respectively applied, in parallel, to the input terminals b of the cells 701 of stages $E_0$ to $E_{Q-1}$ of the row selection circuit. An activation signal EN at logic state 1 is further applied to the input terminal e of cell 703 of stage $E_0$. The output logic signals delivered on terminals h and i of the $2^{Q-1}$ cells 703 of stage $E_{Q-1}$ respectively correspond to the N bits R<0>, R<1>, . . . R<N−1> of a row selection vector R used to decide whether to activate or not in read mode each of the N rows of the array on implementation of the calculation operation.

Figure 8:
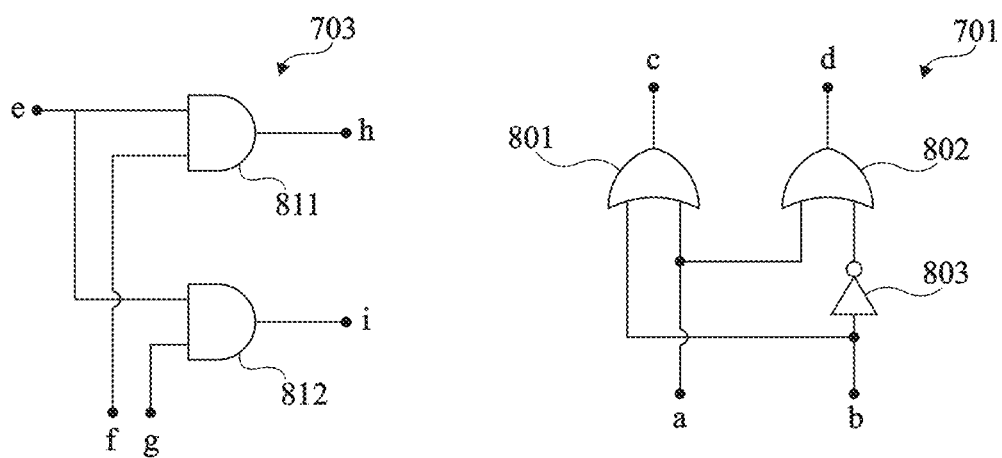
FIG. 8 illustrates in further detail an embodiment of elementary selection cells of the row selection circuit of FIG. 8.

FIG. 8 illustrates in further detail an embodiment of an elementary cell 701 (in the right-hand portion of FIG. 8) of the circuit of FIG. 7, and an embodiment of an elementary cell 703 (in the left-hand portion of FIG. 8) of the circuit of FIG. 7.

In the present example, cell 701 comprises two logic OR gates 801 and 802 having two inputs and one output each. OR gate 801 has a first input connected to the input node a of the cell and a second input connected to the input node b of the cell. OR gate 802 has a first input connected to the input node a of the cell and a second input coupled to the input node b of the cell via an inverter 803. The output node of OR gate 801 is connected to the output node c of the cell, and the output node of OR gate 802 is connected to the output node d of the cell.

In the present example, cell 703 comprises two logic AND gates 811 and 812 having two inputs and one output each. AND gate 811 has a first end connected to the input node e of the cell and a second input connected to the input node f of the cell. AND gate 812 has a first end connected to the input node e of the cell and a second input connected to the input node g of the cell. The output node of AND gate 811 is connected to the output node h of the cell and the output node of AND gate 812 is connected to the output node i of the cell.

Advantageously, on implementation of a calculation operation within memory circuit 550, the preparation of the control signals of memory circuit 550 and the transmission of the control signals to memory circuit 550 may be performed by only using the conventional set of instructions of microprocessor 550. This is made possible by the fact that the control signals of memory circuit 550 in intelligent mode transit over the same data, address, and control buses as the control signals of memory circuit 550 in conventional mode.

As an example, to transmit to memory circuit 550 the control signals necessary to the implementation of a calculation operation within memory circuit 550, it may be provided to use an instruction of the type "store r0, r1" (in assembly language), conventionally used to store the value contained in register r1 at the address of the memory circuit contained in register r0. Before the execution of the actual instruction "store", initial steps of preparation of registers r0 and r1 of the microprocessor to respectively write, into register r1, the instruction signal defining the calculation operation to be performed within memory circuit 550, for example, at the format described in relation with FIG. 6 and, in register r0, the address at which the result of the calculation operation is to be written, may be provided.

An advantage of such an operating mode is its compatibility with existing microprocessors.

As a first variation, to implement a calculation operation within memory circuit 550, the preparation of the control signals of memory circuit 550, and the transmission of these control signals to memory circuit 550 may be performed by using a specific instruction, which adds to the conventional set of instructions of microprocessor 550.

As a second variation, to implement a calculation operation within memory circuit 550, the preparation of the control signals of memory circuit 550 and the transmission of such control signals to memory circuit 550 may be performed by using a specific set of instructions, for example, comprising a specific instruction per type of calculation operation implementable within the memory circuit, the specific set of instructions adding to the conventional set of instructions of microprocessor 550.

The first and second above-mentioned variations have the advantage of easing the compilation of a source code into a sequence of instructions executable by the microprocessor. However, a disadvantage of such variations is their incompatibility with microprocessors which do not recognize the instructions specific to the intelligent operating mode of the memory circuit.

As explained hereabove, an advantage of the system of FIG. 5 is that it enables to perform conventional accesses to memory circuit 550, for example, to perform conventional calculation operations by means of arithmetic and logic unit 504 of microprocessor 500, and intelligent accesses to memory circuit 550, to perform calculation operations directly within memory circuit 550.

On programming of software intended to be executed in such a system, the programmer may take advantage of the two operating modes. As an example, he/she may select on its own initiative, for each calculation operation, whether he/she desires for the operation to be performed conventionally by the arithmetic and logic unit of the microprocessor, or whether he/she desires for the operation to be carried out within the memory circuit. As a variation, such a selection may be automatically performed by source code compilation software, to optimize the program execution speed and/or the power consumption of the system. In this last case, the programmer can use a conventional programming language, which does not enable to directly select the operating mode desired for each operation.

An advantage of the provided system is that conventional accesses to memory circuit 550 and intelligent accesses to memory circuit 550 may be executed in interlaced fashion. It should be noted that, in the intelligent operating mode, certain instructions sent by microprocessor 500 to memory circuit 550 may take a plurality of clock cycles of microprocessor 500 to be executed by memory circuit 550. When such an instruction is being executed by memory circuit 500, other conventional or intelligent instructions may be transmitted to memory circuit 550 and executed in parallel by memory circuit 550, for example, when their concern different rows of memory circuit 550 and/or when the memory is a multi-port memory, and/or during cycles during which memory 550 is not read from or written into in the context of execution of the intelligent instruction. As an example, the instructions transmitted by microprocessor 500 to memory circuit 550 may be pipelined to send a conventional or intelligent instruction to memory circuit 550 for each clock cycle of microprocessor 500.

Specific embodiments have been described. Various alterations and modifications will occur to those skilled in the art. In particular, the intelligent operating mode of the memory circuit may be used to perform operations other than calculation operations. As an example, the intelligent operating mode of the memory circuit may be used to perform a simultaneous writing of same data into a plurality of memory rows. In this case, the rows to the written into may be selected by means of a row selection vector coded according to the coding format described in relation with FIGS. 6, 7, and 8.

Further, the described embodiments are not limited to the example of instruction signal format described in relation with FIGS. 6, 7, and 8 to control the memory circuit in the intelligent operating mode. In particular, in the case of an operation requiring the selection of a limited number of rows, for example, an operation requiring the selection of two rows only (for example, a calculation operation with two operands or an operation of simultaneous writing of same data into two rows of the memory circuit), it may be provided to transmit the complete addresses of the rows to be directly selected over the data bus, without transiting through a coding by means of an operand selection vector, and thus gain at least one clock cycle for the implementation of the operation. One or a plurality of additional addresses of rows to be selected may be transmitted via the address bus.

Further, the described embodiments are not limited to the example of row selection circuit described in relation with FIGS. 7 and 8.

The invention claimed is:

1. A memory circuit comprising:
a plurality of elementary storage cells arranged in an array of rows and of columns;
a data input/output port;
an address input port different from the data input/output;
a mode selection input port; and
an internal control circuit configured to:
read a mode selection signal applied to the mode selection port;
when the mode selection signal is in a first state, read an address of a row from the address input port and implement, via the data input/output port, a read or write operation in this row; and
when the mode selection signal is in a second state, read from the data input/output port an instruction signal and implement an operation comprising the simultaneous activation in read or write mode of at least two rows selected according to the instruction signal,
wherein the instruction signal comprises a first field defining a type of operation to be implemented by the internal control circuit, wherein the internal control circuit is capable of, when the mode selection signal is in the second state, implementing a calculation operation comprising the simultaneous activation in read mode of at least two rows selected according to the instruction signal, and wherein the internal control circuit is further configured to, when the mode selection signal is in the second state, read an address signal from the address input port and write at the corresponding address of the memory circuit a result of the calculation operation.

2. The memory circuit of claim 1, wherein the internal control circuit is capable of, when the mode selection signal is in the second state, implementing an operation of writing same data into at least two rows selected according to the instruction signal.

3. The memory circuit of claim 1, wherein the instruction signal comprises a second field defining the addresses of the rows to be selected for the implementation of the operation.

4. The memory circuit of claim 3, further comprising a row selection circuit configured to generate, from the second field of the instruction signal, a row selection vector over N bits, where N is an integer designating the number of rows of the array.

5. The memory circuit of claim 4, wherein the second field comprises a first sub-field and a second sub-field of $\log_2(N)$ bits each, where N is an integer designating the number of rows of the array.

6. The memory circuit of claim 5, wherein the row selection circuit is capable of generating the row selection vector from the first and second sub-fields of the second field of the instruction signal.

7. The memory circuit of claim 6, wherein the row selection circuit comprises $Q=\log_2(N)$ stages $E_j$, j being an integer in the range from 0 to Q−1, each stage $E_j$ comprising a first logic selection cell comprising first and second input nodes and first and second output nodes, and $2^j$ second logic selection cells, each comprising first, second, and third input nodes and first and second output nodes.

8. The memory circuit of claim 7, wherein:
in each stage $E_j$, each second cell of the stage has its second and third input nodes respectively connected to the first and second output nodes of the first cell in the stage; and
in each stage $E_j$ except for stage $E_{Q-1}$, each second cell of the stage has its first output node connected to the first input node of one of the second cells of stage $E_{j+1}$ and its second output node connected to the first input node of another one of the second cells of stage $E_{j+1}$.

9. The memory circuit of claim 7, wherein:
each first cell comprises first and second logic OR gates, the first OR gate having a first input connected to the first input node of the cell, a second input connected to the second input node of the cell, and an output connected to the first output node of the cell, and the second OR gate having a first input connected to the first input node of the cell, a second input coupled to the second input node of the cell via an inverter, and an output connected to the second output node of the cell; and
each second cell comprises first and second logic AND gates, the first AND gate having a first input connected to the first input node of the cell, a second input connected to the second input node of the cell, and an output connected to the first output node of the cell, and the second AND gate having a first input connected to the first input node of the cell, a second input connected to the third input node of the cell, and an output connected to the second output node of the cell.

10. The memory circuit of claim 7, wherein the internal control circuit is configured to, when the mode selection signal is in the second state, apply the $\log_2(N)$ bits of the first sub-field respectively to the $\log_2(N)$ second input nodes of the first cells (701) of the row selection circuit, and apply the log 2(N) bits of the second sub-field respectively to the $\log_2(N)$ first input nodes of the first cells of the row selection circuit.

11. A system comprising a microprocessor and the memory circuit of claim 1, the system further comprising:
a data bus coupling a data input/output port of the microprocessor to the data input/output port of the memory circuit;
an address bus coupling an address output port of the microprocessor to the address input port of the memory circuit; and
a mode selection bus coupling a mode selection output port of the microprocessor to the mode selection input port of the memory circuit.

12. The system of claim 11, wherein the microprocessor is configured to:
in a first operating mode:
apply a mode selection signal in the first state to the mode selection bus;
apply a row address signal to the address bus; and
read or write data into the corresponding row of the memory circuit via the data bus, and
in a second operating mode:
apply a mode selection signal in the second state to the mode selection bus; and
apply an instruction signal to the data bus.

13. A memory circuit comprising:
a plurality of elementary storage cells arranged in an array of rows and of columns;
a data input/output port;
an address input port different from the data input/output;
a mode selection input port;
an internal control circuit configured to:
read a mode selection signal applied to the mode selection port;
when the mode selection signal is in a first state, read an address of a row from the address input port and implement, via the data input/output port, a read or write operation in this row; and
when the mode selection signal is in a second state, read from the data input/output port an instruction signal and implement an operation comprising the simultaneous activation in read or write mode of at least two rows selected according to the instruction signal,
wherein the instruction signal comprises a first field defining a type of operation to be implemented by the internal control circuit and a second field defining the addresses of the rows to be selected for the implementation of the operation; and
a row selection circuit configured to generate, from the second field of the instruction signal, a row selection vector over N bits, where N is an integer designating the number of rows of the array.

14. The memory circuit of claim 13, wherein the internal control circuit is capable of, when the mode selection signal is in the second state, implementing an operation of writing same data into at least two rows selected according to the instruction signal.

15. The memory circuit of claim 13, wherein the second field comprises a first sub-field and a second sub-field of $\log_2(N)$ bits each, where N is an integer designating the number of rows of the array.

16. The memory circuit of claim 15, wherein the row selection circuit is capable of generating the row selection vector from the first and second sub-fields of the second field of the instruction signal.

17. The memory circuit of claim 16, wherein the row selection circuit comprises $Q=\log_2(N)$ stages $E_j$, j being an integer in the range from 0 to Q−1, each stage $E_j$ comprising a first logic selection cell comprising first and second input nodes and first and second output nodes, and $2^j$ second logic selection cells, each comprising first, second, and third input nodes and first and second output nodes.

18. The memory circuit of claim 17, wherein:
in each stage $E_j$, each second cell of the stage has its second and third input nodes respectively connected to the first and second output nodes of the first cell in the stage; and
in each stage $E_j$ except for stage $E_{Q-1}$, each second cell of the stage has its first output node connected to the first input node of one of the second cells of stage $E_{j+1}$ and its second output node connected to the first input node of another one of the second cells of stage $E_{j+1}$.

19. The memory circuit of claim 17, wherein:
each first cell comprises first and second logic OR gates, the first OR gate having a first input connected to the first input node of the cell, a second input connected to the second input node of the cell, and an output connected to the first output node of the cell, and the second OR gate having a first input connected to the first input node of the cell, a second input coupled to the second input node of the cell via an inverter, and an output connected to the second output node of the cell; and
each second cell comprises first and second logic AND gates, the first AND gate having a first input connected to the first input node of the cell, a second input connected to the second input node of the cell, and an output connected to the first output node of the cell, and the second AND gate having a first input connected to the first input node of the cell, a second input connected to the third input node of the cell, and an output connected to the second output node of the cell.

20. The memory circuit of claim 17, wherein the internal control circuit is configured to, when the mode selection signal is in the second state, apply the $\log_2(N)$ bits of the first sub-field respectively to the $\log_2(N)$ second input nodes of the first cells (701) of the row selection circuit, and apply the $\log 2(N)$ bits of the second sub-field respectively to the $\log_2(N)$ first input nodes of the first cells of the row selection circuit.

21. A system comprising a microprocessor and the memory circuit of claim 13, the system further comprising:
a data bus coupling a data input/output port of the microprocessor to the data input/output port of the memory circuit;
an address bus coupling an address output port of the microprocessor to the address input port of the memory circuit; and
a mode selection bus coupling a mode selection output port of the microprocessor to the mode selection input port of the memory circuit.

22. The system of claim 21, wherein the microprocessor is configured to:
in a first operating mode:
apply a mode selection signal in the first state to the mode selection bus;
apply a row address signal to the address bus; and
read or write data into the corresponding row of the memory circuit via the data bus, and
in a second operating mode:
apply a mode selection signal in the second state to the mode selection bus; and
apply an instruction signal to the data bus.

23. The memory circuit of claim 13, wherein the internal control circuit is capable of, when the mode selection signal is in the second state, implementing a calculation operation comprising the simultaneous activation in read mode of at least two rows selected according to the instruction signal.

24. The memory circuit of claim 23, wherein the internal control circuit is further configured to, when the mode selection signal is in the second state, read an address signal from the address input port and write at the corresponding address of the memory circuit a result of the calculation operation.

* * * * *